United States Patent
Dsouza

(10) Patent No.: US 8,104,002 B2
(45) Date of Patent: Jan. 24, 2012

(54) PERFORMING LOGIC OPTIMIZATION AND STATE-SPACE REDUCTION FOR HYBRID VERIFICATION

(75) Inventor: Ashvin M. Dsouza, Chelmsford, MA (US)

(73) Assignee: Synopsys, Inc., Mountain View, CA (US)

( * ) Notice: Subject to any disclaimer, the term of this patent is extended or adjusted under 35 U.S.C. 154(b) by 358 days.

(21) Appl. No.: 12/361,282

(22) Filed: Jan. 28, 2009

(65) Prior Publication Data

US 2010/0192111 A1 Jul. 29, 2010

(51) Int. Cl.
*G06F 17/50* (2006.01)

(52) U.S. Cl. .................................. 716/106; 716/132

(58) Field of Classification Search .................. 716/100, 716/106, 132
See application file for complete search history.

(56) References Cited

U.S. PATENT DOCUMENTS

| 6,182,258 | B1 | 1/2001 | Hollander | |
|---|---|---|---|---|
| 6,567,971 | B1 | 5/2003 | Banzhaf | |
| 6,591,402 | B1 * | 7/2003 | Chandra et al. | 716/106 |
| 7,882,473 | B2 * | 2/2011 | Baumgartner et al. | 716/106 |
| 2003/0115562 | A1 | 6/2003 | Martin | |
| 2007/0156378 | A1 * | 7/2007 | McNamara | 703/14 |
| 2007/0299648 | A1 * | 12/2007 | Levitt et al. | 703/22 |
| 2009/0138837 | A1 * | 5/2009 | Baumgartner et al. | 716/6 |

OTHER PUBLICATIONS

Kukula, James H., et al., "Building Circuits from Relations", Synopsys, inc., Beaverton, Oregon.
Aagaard, Mark D., et al., "Formal Verification Using Parametric Representations of Boolean Constraints", Strategic CAD Labs, Intel Corporation, pp. 402-407.

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

One embodiment of the present invention provides a system that facilitates optimization and verification of a circuit design. The system can receive a set of assumptions associated with a circuit. The set of assumptions can specify a set of logical constraints on at least a set of primary inputs of the circuit. Note that the set of assumptions are expected to be satisfied during normal circuit operation. The system can generate a stimulus generator based in part on an assumption in the set of assumptions. The output values from the stimulus generator, which when assigned to the set of primary inputs of the circuit, cause the set of primary inputs to satisfy the assumption. Next, the system can generate a modified circuit by coupling the outputs of the stimulus generator with a set of primary inputs of the circuit. The system can then perform logic optimization on the modified circuit to obtain an optimized circuit.

24 Claims, 12 Drawing Sheets

PERFORMING LOGIC OPTIMIZATION AND STATE-SPACE REDUCTION FOR HYBRID VERIFICATION

BACKGROUND

1. Field

The present invention generally relates to electronic design automation. More specifically, the present invention relates to techniques and systems for optimizing a circuit design for formal circuit verification.

2. Related Art

Describing a circuit using a high-level hardware description language allows hardware engineers to define the circuit's functionality and to optimize the circuit's architecture before converting the high-level description into a detailed physical layout for the circuit.

The goal of circuit verification is to determine whether the circuit is expected to behave as desired under normal operating conditions. A circuit can be verified using different techniques which include formal verification techniques, simulation-based verification techniques, and hybrid verification techniques which combine elements of both formal verification techniques and simulation-based verification techniques.

Formal verification techniques attempt to prove that the circuit under verification (CUV) will behave as desired during operation. Formal verification techniques typically utilize two types of logical conditions: assumptions and assertions. Assumptions are logical conditions that are used to model the runtime environment, and assertions are logical conditions that define the desired behavior of the CUV. Unfortunately, it can sometimes be computationally impractical to formally verify circuits that are large and complex.

Simulation-based verification techniques simulate the CUV to ensure that the CUV is behaving as desired. Compared to formal verification, simulation usually requires fewer computational resources. Unfortunately, simulation-based verification techniques usually cannot guarantee that the CUV will behave as desired because it is usually impractical to cover the entire state space.

In a hybrid verification technique, the verification tool can simulate the CUV, and when the circuit reaches a state that is of interest, the tool can formally verify assertions for the CUV. Hybrid verification techniques can provide the best of both worlds: they require fewer computational resources than formal verification techniques, and they are more rigorous than simulation-based verification techniques.

Regardless of which circuit verification technique is used, a significant portion of the time-to-market is usually spent on verifying the circuit. Hence, it is desirable to improve the performance of verification tools because it can have a dramatic impact on the time-to-market.

SUMMARY

One embodiment of the present invention provides a system that facilitates optimization and verification of a circuit design. The system can receive a set of assumptions associated with a circuit. The set of assumptions can specify a set of logical conditions (e.g., logical constraints) on at least a set of primary inputs of the circuit. Note that the set of assumptions are expected to be satisfied during normal circuit operation. The system can generate a stimulus generator based in part on an assumption in the set of assumptions. The output values from the stimulus generator, which when assigned to the set of primary inputs of the first circuit, cause the set of primary inputs to satisfy the assumption. Next, the system can generate a modified circuit by coupling the outputs of the stimulus generator with a set of primary inputs of the circuit. The system can then perform logic optimization on the modified circuit to obtain an optimized circuit.

In some embodiments, the system can receive a set of assertions associated with the first circuit. Note that the set of assertions specify logical constraints on at least a set of outputs of the first circuit, and the set of assertions model a desired behavior of the first circuit. Then, the system can perform functional verification on the optimized circuit to verify that the set of assertions are satisfied whenever the set of assumptions are satisfied.

In some embodiments, the set of assertions can specify logical constraints on the set of primary inputs of the first circuit, a set of state variables of the first circuit, and a set of outputs of the first circuit.

In some embodiments, the set of assumptions can specify logical constraints on the set of primary inputs of the first circuit, a set of state variables of the first circuit, and a set of outputs of the first circuit.

In some embodiments, the system can generate the stimulus generator by first partitioning the set of assumptions into a set of assumption groups, such that the set of assumption groups includes a first assumption group and a second assumption group. Note that any two assumptions in an assumption group can share at least one common primary input, and the first assumption group's primary inputs can be disjoint from the second assumption group's primary inputs. The system can then generate a first portion of the stimulus generator based in part on the first assumption group, and can generate a second portion of the stimulus generator based in part on the second assumption group.

In some embodiments, a number of primary inputs can be treated as state variables when creating a stimulus generator. Therefore, when two assumptions only share a subset of these primary inputs, one of the two assumptions can be placed in a first assumption group, and the other assumption can be placed in a second assumption group.

In some embodiments, the system can generate the stimulus generator by first selecting a first assumption from the set of assumptions, and generating a first portion of the stimulus generator to satisfy the logical constraints for the primary inputs of the first assumption. Then, while assumptions remain in the set of assumptions, the system can select a second assumption from the set of assumptions, and can generate a second portion of the stimulus generator which satisfies the logical constraints for the primary inputs of the second assumption which are not covered by the first portion of the stimulus generator. The system can then append the second portion of the stimulus generator to the first portion of the stimulus generator, thereby generating a new first portion of the stimulus generator which can satisfy the logical constraints for the primary inputs of the second assumption.

In some embodiments, the system can generate the first portion of the stimulus generator to satisfy the logical constraints for the primary inputs of the first assumption by first processing the first assumption to enumerate, for a respective legal state of the circuit, a number of legal values for a set of primary inputs. Then, the system can generate an input multiplexer associated with a respective legal state of the circuit, which can comprise a first set of input signals, a first select signal, and a first output signal. To generate the input multiplexer, the system can couple an input signal of the first set of input signals to a corresponding legal primary input value for the legal state of the circuit, can couple the first select signal to a random variable which identifies an input signal of the first set of input signals, and can configure the first output signal to propagate a value from the identified input signal of the first set of input signals. The system can also generate an output multiplexer comprising a second set of input signals, a second select signal, and a second output signal. To generate the output multiplexer, the system can couple an input signal of the second set of input signals to the first output signal of a corresponding input multiplexer, and couple the second select signal to a state variable of the circuit to identify an input signal of the second set of signals. Furthermore, the system can configure the second output signal to propagate a value from the identified input signal of the second set of input signals.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Integrated Circuit (IC) Design Flow

Figure 1:
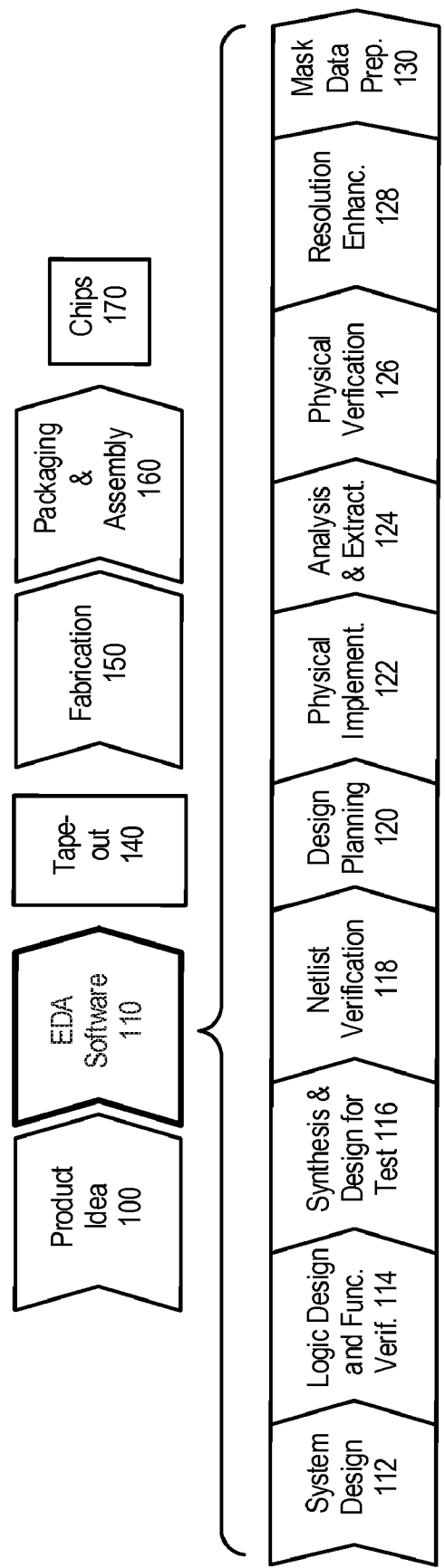
FIG. 1 illustrates various stages in the design and fabrication process of an integrated circuit in accordance with an embodiment of the present invention.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Sabe®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCX™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Overview

Figure 2:
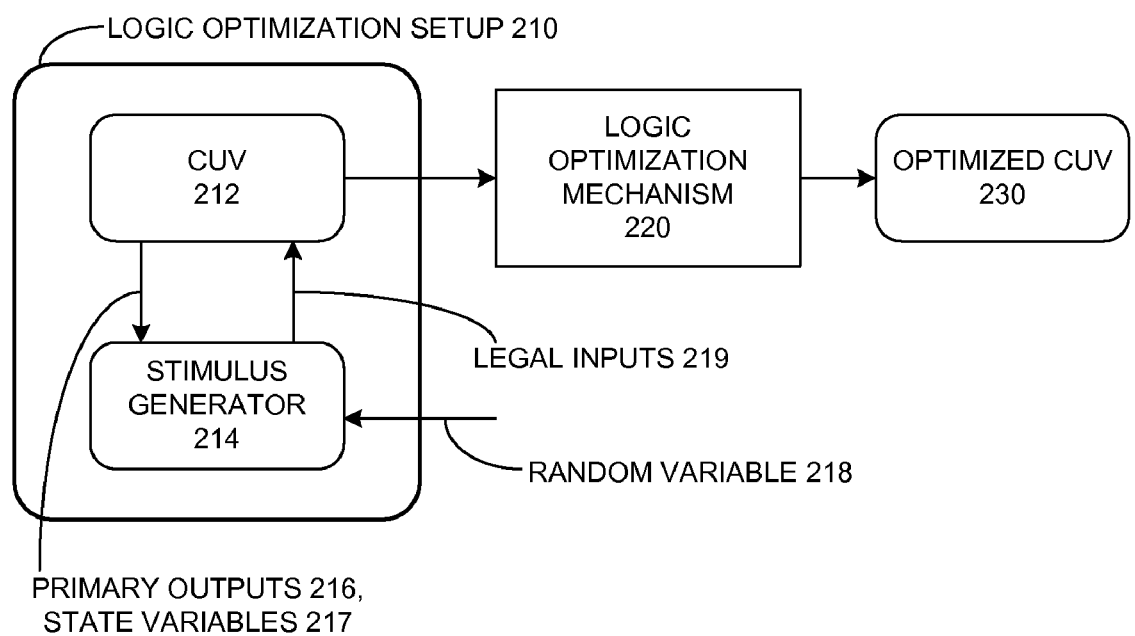
FIG. 2 illustrates an exemplary process for performing logic optimization on a CUV in accordance with an embodiment of the present invention.

FIG. 2 illustrates an exemplary process for performing logic optimization on a CUV in accordance with an embodiment of the present invention. CUV 212 is optimized by first creating a logic optimization setup 210, which includes a stimulus generator 214 for CUV 212. Then, a logic optimization mechanism 220 processes CUV 212 to produce an optimized CUV 230. Stimulus generator 214 takes as input primary outputs 216 and state variables 217 from CUV 212, and also takes as input a random variable 218; stimulus generator uses these inputs to generate legal inputs 219 for input signals of CUV 212. Stimulus generator 214 specifies, for each legal state of CUV 212, a set of legal primary input values, thereby enabling logic optimization mechanism 220 to determine how to restrict the state space of CUV 212 to generate optimized CUV 230.

Assumptions

In some embodiments of the present invention, the system generates a stimulus generator by analyzing a set of assumptions. An assumption specifies logical conditions (e.g., logical constraints) which a set of primary inputs of the circuit are expected to satisfy during normal circuit operation, and can be associated with a number of primary inputs, state variables, and/or primary outputs of the circuit. An assumption is said to be an N-tight assumption if and only if the number of primary input values, n, being constrained by the assumption for every state, s, satisfies the relation $n_s \leq N$. In other words, an assumption is an N-tight assumption if the assumption satisfies the following property:

$$\forall s \left( \max_s (n_s) \leq N \right).$$

An assumption is represented using the notation U(s, i), where s is a vector of state variables from the CUV, and i is a vector of primary inputs to the CUV. In some embodiments, the set of legal primary input values, $U_{legal}$, is defined as follows:

$$U_{legal} = \bigcup_{j=0}^{2^{|s|}-1} \bigcup_{k=0}^{n_{s_j}-1} \{(s_j, i_k^{s_j})\}.$$

The expression for $U_{legal}$ is a union of all legal primary input values for every state of the CUV, and is represented with two nested union operations. The outer union operation uses variable j to span every state of the CUV, where |s| represents the number of bits used by all state variables of the CUV. The inner union operation uses a variable k to span, for a respective state $s_j$, the number of legal primary input values, $n_{s_j}$. Furthermore, $s_j$ represents the $j^{th}$ value for state vector s, and $i_k^{s_j}$ represents the $k^{th}$ legal primary input value for state $s_j$.

Note that for a state $s_j$ which is not a legal state, $n_{s_j}=0$, and the inner union operation does not span across any values for variable k. Therefore, the variables j and k span across the set of legal primary input values for every state of the CUV, and the expression $(s_j, i_k^{s_j})$ represents a legal pairing for state $s_j$ and primary input value $i_k^{s_j}$. Furthermore, $(s_j, k_k^{s_j}) \in U_{legal}$ if and only if $U(s_j, i_k^{s_j})=1$.

In some embodiments, the system can compute $U_{legal}$ for an assumption using SAT enumeration. In other embodiments, the system can compute $U_{legal}$ for an assumption by constructing a binary decision diagram (BDD) for the assumption, and analyzing the BDD. In further embodiments, the system can compute $U_{legal}$ for an assumption by using a combination of SAT enumeration and BDD analysis.

Stimulus Generator

A stimulus generator is represented using the notation $f(s, r)$, where s is the state variable of the CUV, and r is a random variable whose range of possible values satisfies $0 \leq r < N$. In some embodiments, a stimulus generator can be implemented as a vector of legal random values, $i_r^s$, for a number of primary inputs of the CUV. During operation, a set of legal random values for a number of primary inputs of the CUV can be selected by the current state of the CUV, s, and the random variable, r. The number of legal random values chosen for a respective state of the CUV is restricted by the parameter N. In some variations, the number of legal random values chosen for a respective state of the CUV is restricted to log(N).

In some embodiments, a stimulus generator implements function $f(s,r)$ as follows:

$$f(s, r) = \begin{cases} i_r^s: & 0 \leq r < n_s \\ i_0^s: & \text{otherwise.} \end{cases}$$

The number of legal primary input values, n, generated for a respective state of the CUV can vary across states, such that $n_s \leq N$. In some variations, the random variable r is assigned a value irrespective of the state of the CUV, such that r satisfies $0 \leq r < N$. Therefore, when variables r and n satisfy the relation $r \geq n_s$ for a state s of the CUV, function $f(s,r)$ returns a default input vector. The default input vector for a state s can be associated with a random value r=0 (i.e., $i_o{}^s$). On the other hand, when variables r and n satisfy the relation $0 \leq r < n_s$ for a state s of the CUV, function $f(s,r)$ can return an input vector $i_r{}^s$.

Figure 3:
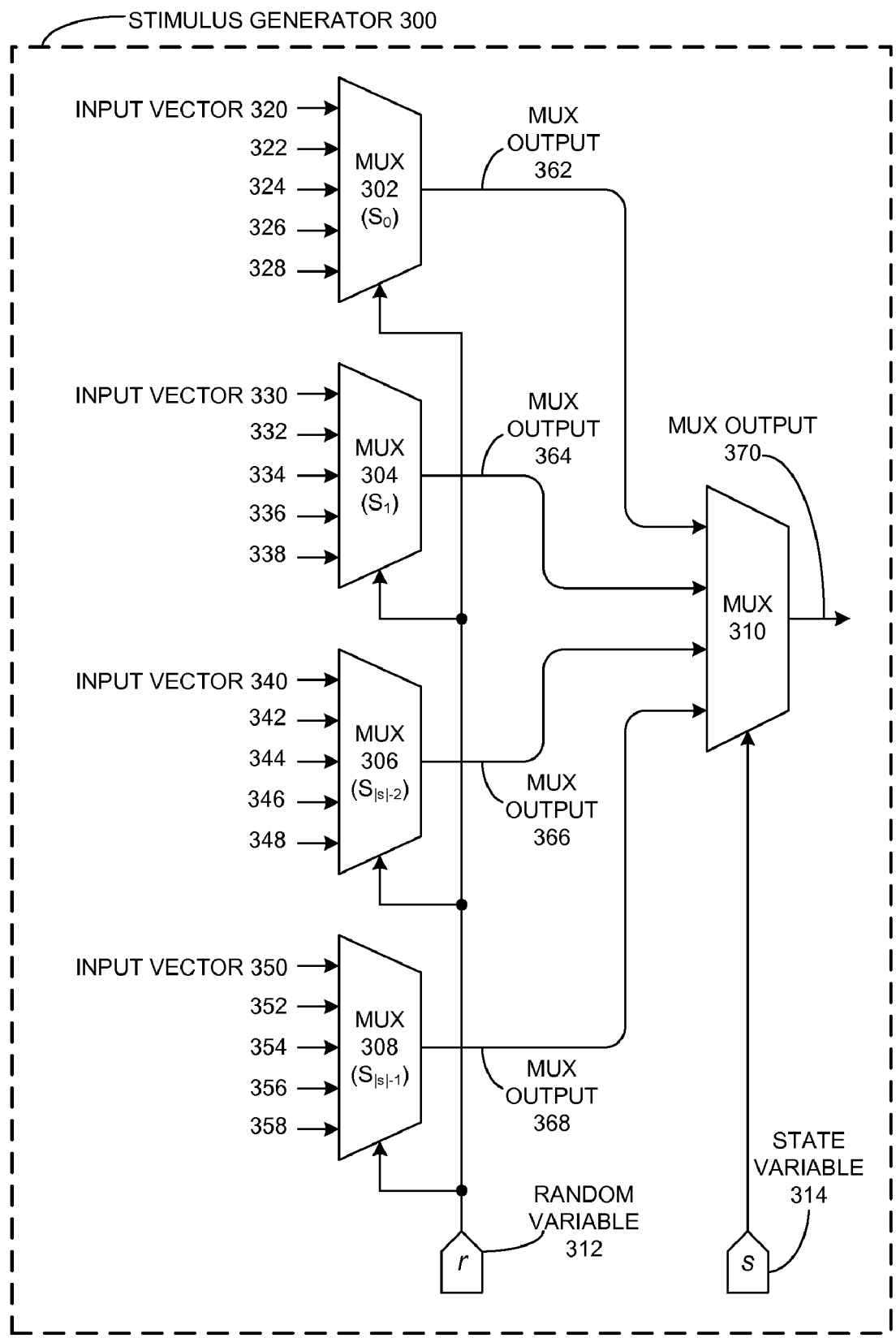
FIG. 3 illustrates a stimulus generator in accordance with an embodiment of the present invention.

FIG. 3 illustrates a stimulus generator in accordance with an embodiment of the present invention. Stimulus generator 300 is implemented as a two-level multiplexer structure, which includes a number of first-level multiplexers 302-308, and a second-level multiplexer 310. A first-level multiplexer (e.g., multiplexer 302) is coupled to a number of primary input vectors (e.g., input vectors 320-328) which are associated with a corresponding state of the CUV (e.g., state $s_0$). Furthermore, the first-level multiplexer is also coupled to a random variable 312, which is used to select a corresponding primary input vector to propagate toward the output of the first-level multiplexer.

Second-level multiplexer 310 is coupled to multiplexer outputs 362-368 from first-level multiplexers 302-308, and is coupled to a state variable 314 which is used to select a first-level multiplexer output (e.g., multiplexer output 362) to propagate toward a second-level multiplexer output 370. Furthermore, multiplexer output 370 can be coupled to the primary inputs of the CUV to drive the CUV with legal primary input values.

In some variations on these embodiments, when variables r and n satisfy the relation $r \geq n_s$ for a state s of the CUV, a corresponding input multiplexer of stimulus generator 300 is configured to select a default input vector. In some variations, the default input vector for a state s can be associated with a random value r=0 (i.e., $i_o{}^s$). On the other hand, when variables r and n satisfy the relation $0 \leq r < n_s$ for a state s of the CUV, a corresponding input multiplexer of stimulus generator 300 is configured to select an input vector $i_r{}^s$.

Multiple Assumptions

The environment of a CUV is usually modeled using multiple assumptions. In some embodiments, a set of assumptions, which represent the environment of a CUV, can be used to create a number of stimulus generator portions that generate input vectors for the primary inputs of the CUV. In one variation on this embodiment, a number of stimulus generator portions can be created by partitioning the set of assumptions into a number of equivalence classes. In a second variation, a number of stimulus generator portions can be created by using a sequential composition technique which converts a sequence of assumptions into a sequence of stimulus generator portions, and then chains the resulting sequence of stimulus generator portions to form an encompassing stimulus generator. In a third variation, a number of stimulus generator portions can be created from a set of assumptions by first partitioning the set of assumptions into a number of disjoint assumption groups, and then applying the sequential composition technique to generate a stimulus generator portion for a respective disjoint assumption group. In a fourth variation, a number of primary inputs can be treated as state variables when creating a stimulus generator portion. Therefore, when two assumptions only share a subset of these primary inputs, one of the two assumptions can be used to create a first stimulus generator portion, and the other assumption can be used to create a second stimulus generator portion. Furthermore, if the full set of primary inputs for an assumption are treated as state variables, then the assumption is not used to create a stimulus generator portion.

Figure 4:
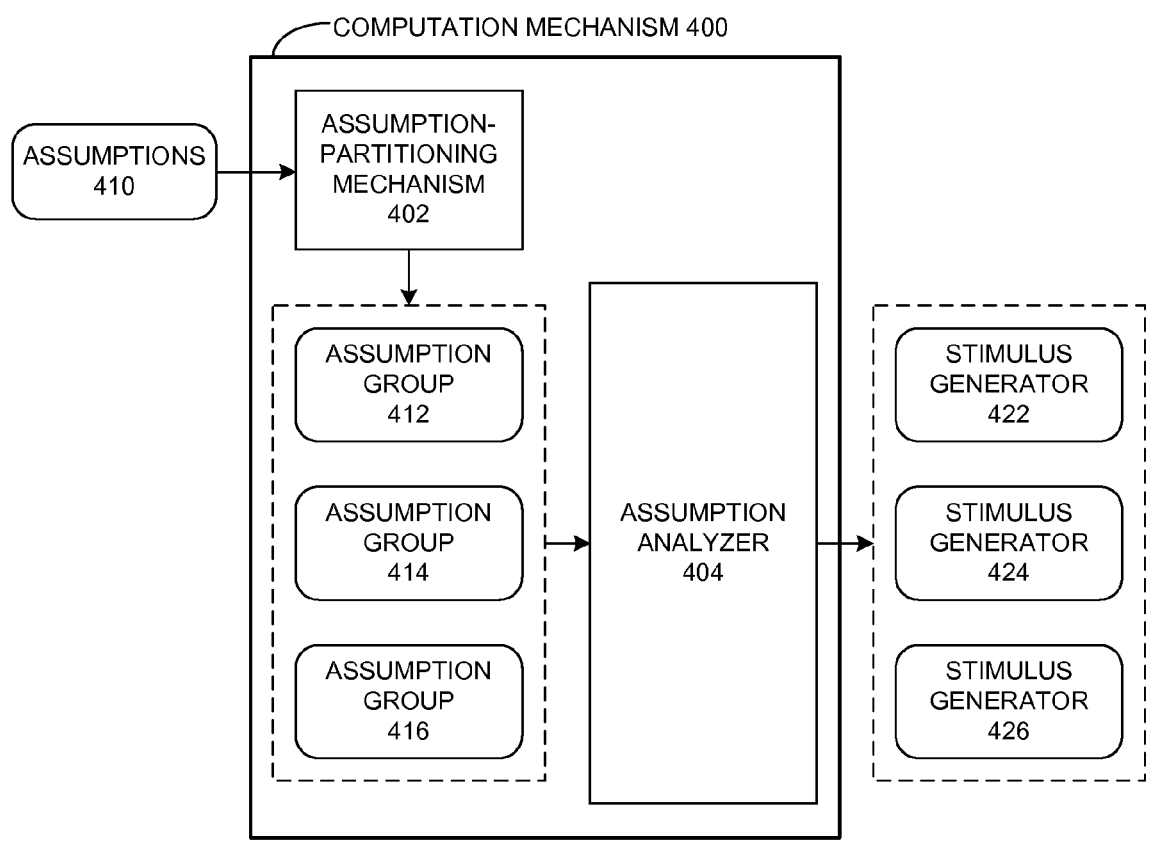
FIG. 4 illustrates a computation mechanism that generates a number of stimulus generator portions by partitioning a set of assumptions into equivalence classes in accordance with an embodiment of the present invention.

FIG. 4 illustrates a computation mechanism that generates a number of stimulus generator portions by partitioning a set of assumptions into equivalence classes in accordance with an embodiment of the present invention. Computation mechanism 400 includes an assumption-partitioning mechanism 402 and an assumption analyzer 404. Assumption-partitioning mechanism 402 takes a set of assumptions 410 as input, and partitions assumptions 410 into a number of disjoint assumption groups 412-416. The assumptions within a disjoint assumption group form an equivalence class, such that they share at least one common primary input variable, and a first assumption group has a disjoint set of primary input variables from a second assumption group. Assumption analyzer 404 takes a respective assumption group as input (e.g., assumption group 412), and generates a corresponding stimulus generator portion (e.g., stimulus generator portion 422) which satisfies the set of assumptions for the assumption group.

Figure 5:
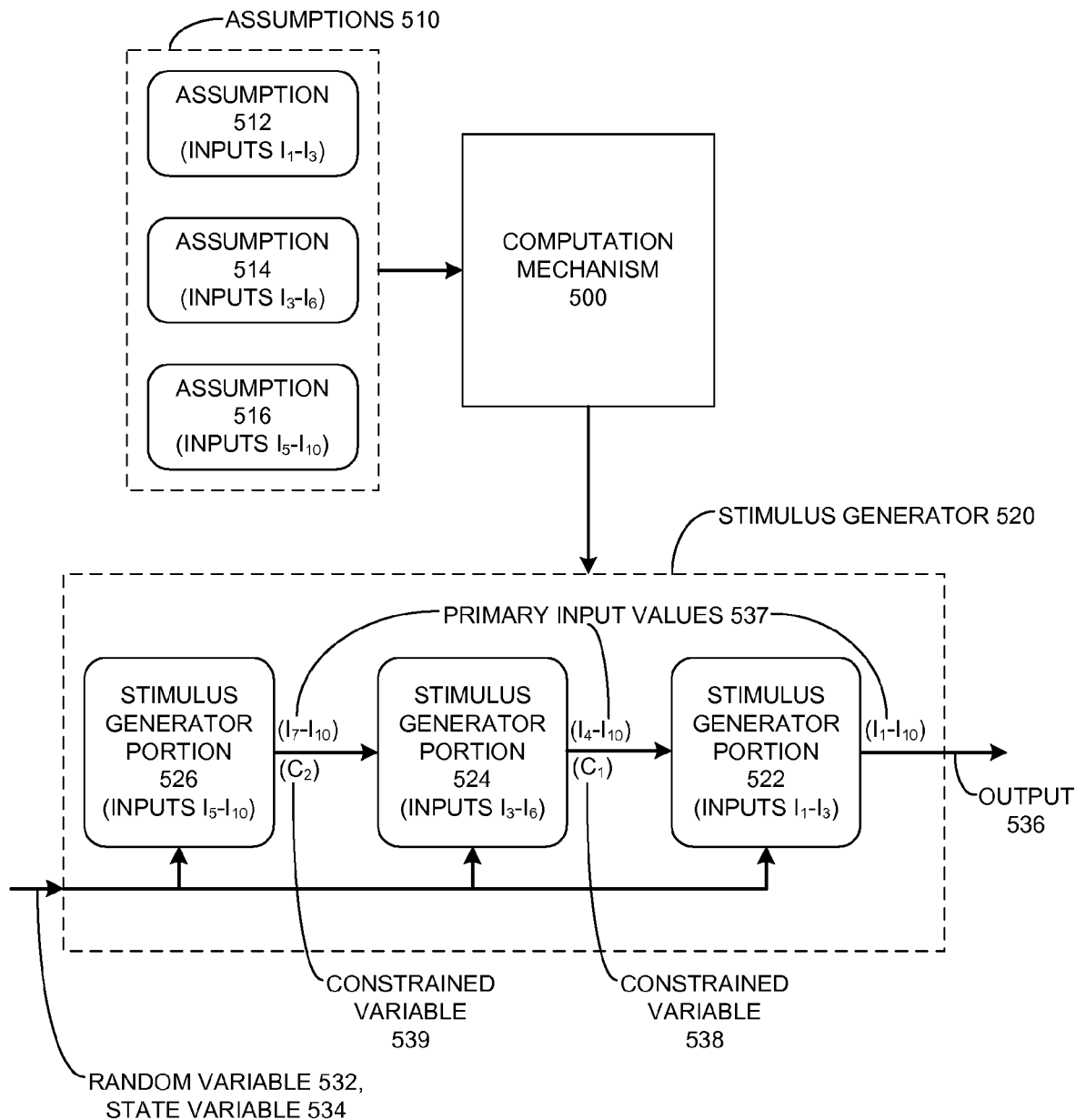
FIG. 5 illustrates a computation mechanism that generates a stimulus generator from a set of assumptions by creating a sequential composition from a number of stimulus generator portions in accordance with an embodiment of the present invention.

FIG. 5 illustrates a computation mechanism that generates a stimulus generator from a set of assumptions by creating a sequential composition from stimulus generator portions in accordance with an embodiment of the present invention. During operation, computation mechanism 500 takes a number of assumptions 512-516 as input, and creates a corresponding number of stimulus generator portions 522-526 in a sequence, such that two stimulus generator portions do not attempt to generate vectors for a common primary input variable. Furthermore, the outputs from a respective stimulus generator portion become inputs to a subsequent stimulus generator portion in the sequence.

In some embodiments, when two assumptions share a number of primary input variables, computation mechanism 500 can use constrained variables to facilitate generating vectors for the shared primary inputs. Therefore, when two stimulus generator portions correspond to two assumptions with one or more shared primary input variables, the first stimulus generator portion can propagate a number of constrained variables to the second stimulus generator portion for generating vectors for the shared primary input variables. Note that the constrained variables can serve in a capacity similar to random variables, and they can localize the effects of shared primary inputs between assumptions.

For illustration purposes, assumption 512 specifies constraints on primary input variables $I_1$-$I_3$, assumption 514 specifies constraints on primary inputs $I_3$-$I_6$, and assumption 516 specifies constraints on primary inputs $I_5$-$I_{10}$. In a first iteration, computation mechanism 500 creates stimulus generator portion 522 for assumption 512 to satisfy constraints for inputs $I_1$-$I_3$, and provides stimulus generator portion 522 with with random variable 532, state variable 534, and constrained variable 538 as inputs. Note that constrained variable 538 is an additional variable which computation mechanism 500 determines is required by stimulus generator portion 522 for generating a vector for shared primary input $I_3$.

In a second iteration, computation mechanism 500 creates stimulus generator portion 524 for assumption 514 to satisfy constraints for primary inputs $I_3$-$I_6$, and accounts for shared primary input 13 also occurring in assumption 512. Computation mechanism 500 provides stimulus generator 524 with random variable 532, constrained variable 539, and state variable 534 as inputs. Note that constrained variable 539 is an additional variable which computation mechanism 500 determines is required by stimulus generator portion 524 for generating a vector for shared primary inputs $I_5$-$I_6$. Furthermore, computation mechanism 500 configures stimulus generator portion 524 to provide stimulus generator portion 522 with primary inputs $I_4$-$I_6$ and constrained variable 538. Stimulus generator portion 522 uses constrained variable 538 from stimulus generator portion 524 to satisfy the constraint for primary input $I_3$ of assumption 512.

In a third iteration, computation mechanism 500 similarly creates stimulus generator portion 526 for assumption 516 to satisfy constraints for primary inputs $I_5$-$I_{10}$, and accounts for shared primary inputs $I_5$ and $I_6$ also occurring in assumption 514. Computation mechanism 500 provides stimulus generator portion 526 with random variable 532, and state variable 534 as inputs. Furthermore, computation mechanism 500 configures stimulus generator portion 526 to provide stimulus generator portion 524 with primary inputs $I_7$-$I_{10}$ and constrained variable 539. Stimulus generator portion 524 uses the constrained variables 539 from stimulus generator portion 526 to satisfy the constraint for primary inputs $I_5$-$I_6$ of assumption 514.

In some variations on this embodiment, computation mechanism 500 implements the sequential composition of stimulus generator 520 by iterating through assumptions 510 in a sequence of increasing N-tight complexity, and creating stimulus generator portions 522-526 from assumptions 512-516. That is, at a respective iteration in the sequential composition process, computation mechanism 500 selects an assumption from the set of assumptions 510 which has primary input variables with the smallest number of possible legal values, and creates a stimulus generator portion for the selected assumption.

Logic Optimization

Figure 6:
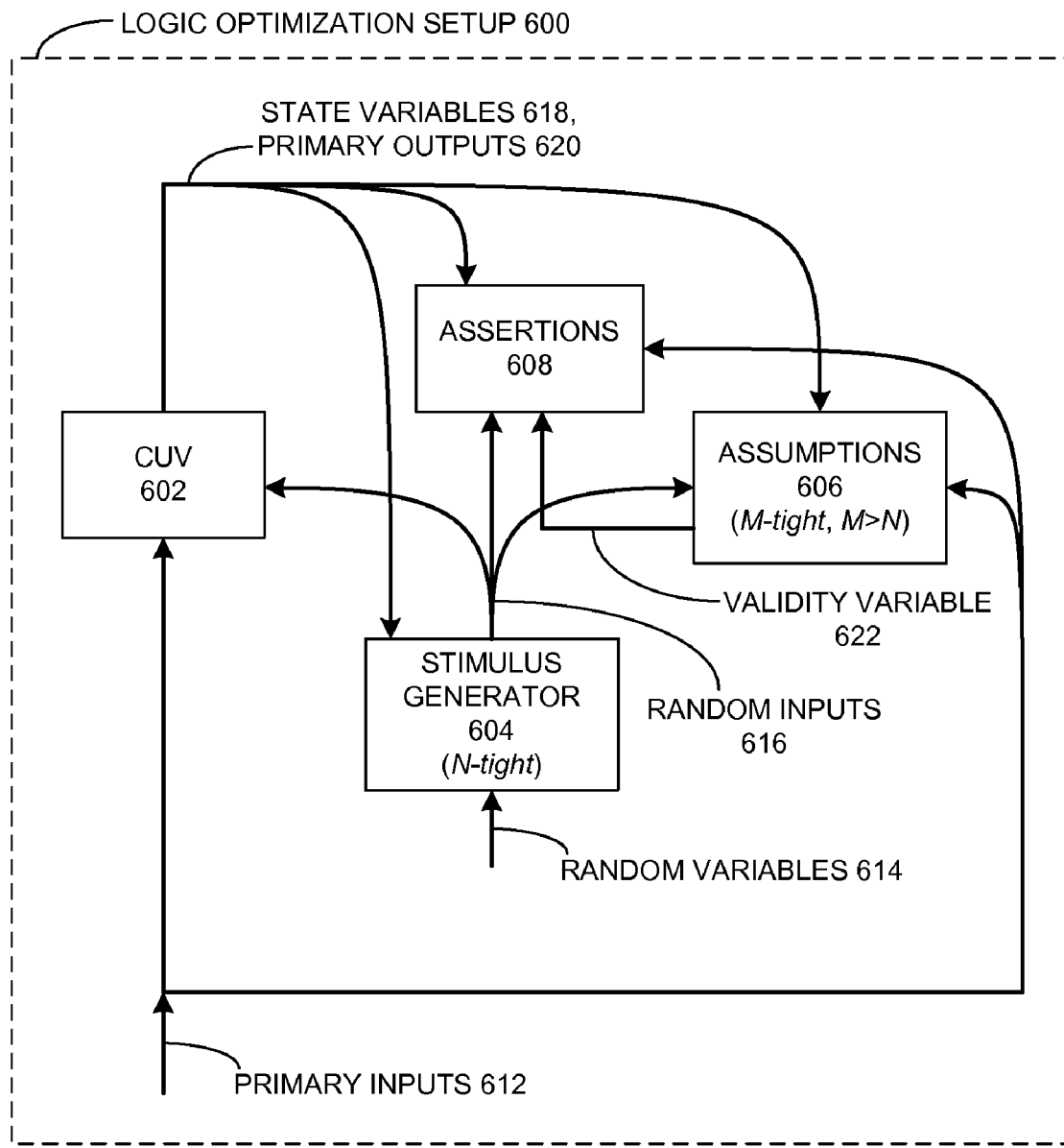
FIG. 6 illustrates a logic optimization setup for performing logic optimization on a CUV in accordance with an embodiment of the present invention.

FIG. 6 illustrates a logic optimization setup for performing logic optimization on a CUV in accordance with an embodiment of the present invention. Logic optimization setup 600 includes a CUV 602, a stimulus generator 604, a set of assumptions 606, and a set of assertions 608. CUV 602 is coupled to stimulus generator 604 through random inputs 616, which specify a set of possible legal values for a number of primary input variables for CUV 602. Furthermore, stimulus generator 604 is coupled to CUV 602 through state variables 618 and primary outputs 620, which specify the computation results from CUV 602. This configuration between CUV 602 and stimulus generator 604 enables a logic optimization system to optimize CUV 602 for the legal primary input and state values of CUV 602.

In some embodiments, CUV 602 takes as input a number of random inputs 614 generated by stimulus generator 604 and a number of primary inputs 612, and propagates state variables 618 and primary outputs 620 to assumptions 606 and to assertions 608. Stimulus generator 604 takes one or more random variables 614 as input, and generates a set of vectors for random inputs 616, which propagate to CUV 602, assumptions 606, and assertions 608. Furthermore, stimulus generator 604 is N-tight, such that it stores a maximum of N legal primary input values for a respective state of CUV 602.

In some embodiments, assumptions 606 can take as input primary inputs 612, random inputs 616, state variables 618, and primary outputs 620. Furthermore, assumptions 606 can generate a validity variable 622, which propagates to assertions 608, and identifies whether the constraints in assumptions 606 are satisfied by the operating environment of CUV 602 (i.e., the constraints have not failed due to an illegal combination of primary inputs 612, random inputs 616, state variables 618, and/or primary outputs 620). In some variations on these embodiments, assumptions 606 are M-tight, such that M>N; therefore, assumptions 606 can represent a larger legal environment for CUV 602 than stimulus generator 604.

In some embodiments, assertions 608 can take as input primary inputs 612, random inputs 616, state variables 618, primary outputs 620, and validity variable 622. Furthermore, assertions 608 can determine whether a number of constraints for CUV 602 are satisfied, and assertions 608 do not fail when validity variable 622 specifies that CUV 602 is not operating in a legal state with legal primary input values (i.e., at least one assumption in assumptions 606 has failed).

An optimized CUV is generated as a modified circuit from CUV 602, such that the modifications can introduce a number of signals into CUV 602, remove a number of signals from CUV 602, and/or alter properties from a number of signals within CUV 602. In some embodiments, stimulus generator 604 is used to map the signals between CUV 602 and an optimized CUV. In doing so, stimulus generator 604 is used to drive a vector sequence into the primary inputs of the optimized CUV, and the same vector sequence is then driven into CUV 602. Then, the responses from state variables and primary outputs are compared between the optimized CUV and CUV 602 to determine a signal mapping between CUV 602 and the optimized CUV. In some embodiments, this signal mapping between CUV 602 and the optimized CUV is used to modify assumptions 606 and assertions 608 to reflect the modifications to CUV 602.

Dead-End Detector

It is possible for a legal operating environment of a CUV to allow for dead-end states in the finite state machine (FSM) of the CUV. That is, for some state s of the CUV, $U(s,i)$ is unsatisfiable. The outcome of a dead-end state in an FSM is that the CUV does not produce valid state or primary output values, given that a legal input value, i, does not exist for the dead-end state of the CUV. Therefore, an assertion for the CUV should not fail once the FSM of the CUV enters a dead-end state, because the input values to the assertion are not legal values, and the subsequent behavior of the CUV is invalid.

In some embodiments, a dead-end detector is configured to determine when the FSM of the CUV is operating within a dead-end state. The set of dead-end states, D, are defined by the expression:

$$D=\{s|\forall i.(U(s,i)=0)\}.$$

During operation, the dead-end detector can determine when the FSM of the CUV is operating within a dead-end state by computing the expression:

$$d(s,r)=U(s,f(s,r)).$$

In some embodiments, the dead-end detector determines whether a state s of the FSM of the CUV is at a dead-end state by determining whether $d(s,r)$ evaluates to 0 for all $r \in [0,N)$.

Formal Verification

Figure 7:
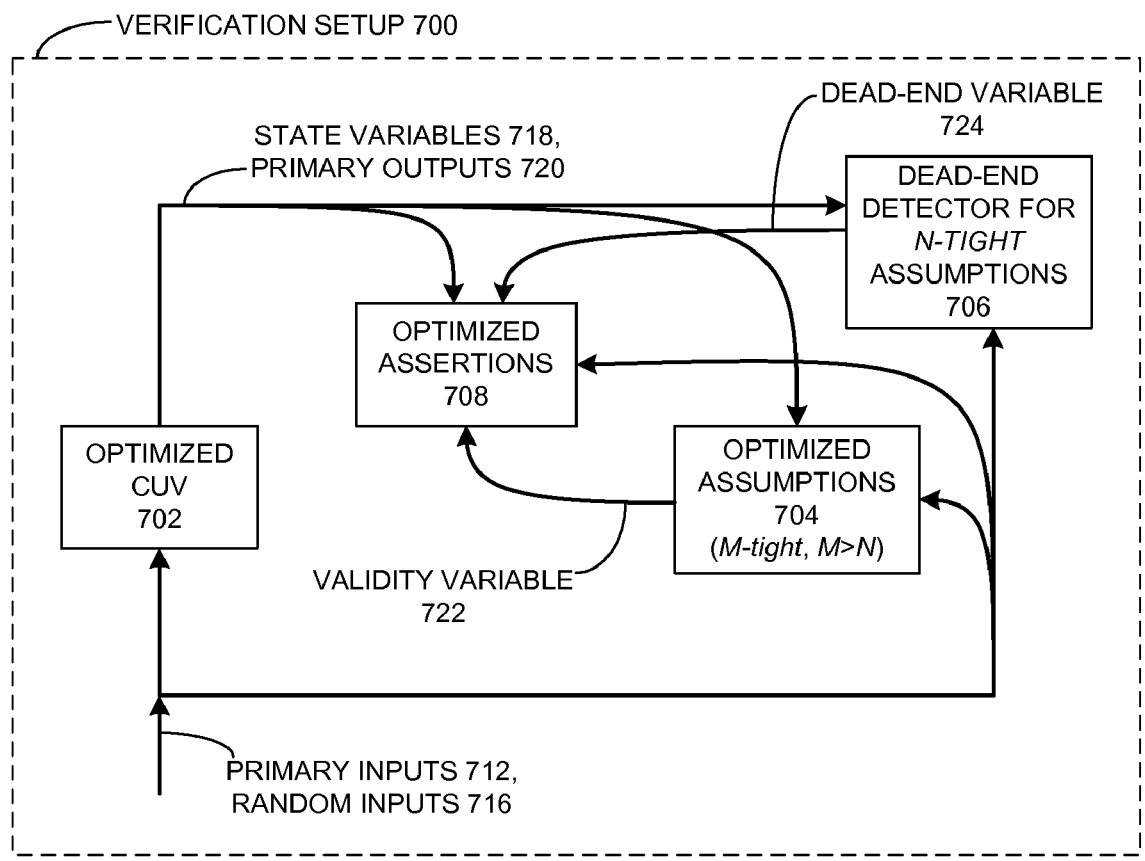
FIG. 7 illustrates a verification setup for performing formal verification on an optimized CUV in accordance with an embodiment of the present invention.

FIG. 7 illustrates a verification setup for performing formal verification on an optimized CUV in accordance with an embodiment of the present invention. Verification setup 700 includes an optimized CUV 702, a set of optimized assumptions 704, a dead-end detector 706, and a set of optimized assertions 708. Optimized assumptions 704 and optimized assertions 708 are modified versions of assumptions 606 and assertions 608 of FIG. 6, which reflect the optimizations performed on CUV 602 of FIG. 6 to generate optimized CUV 702.

Optimized CUV 702, optimized assumptions 704, dead-end detector 706, and optimized assertions 708 take as input primary inputs 712 and random inputs 716. Furthermore, optimized CUV 702 is coupled to optimized assumptions 704, dead-end detector 706, and optimized assertions 708 through state variables 718 and primary outputs 720, which specify the computation results for optimized CUV 702. This configuration enables a verification system to ensure that optimized CUV 702 is operating within a legal operating environment when verifying the functionality of optimized CUV 702.

Dead-end detector 706 takes as input primary inputs 712, random inputs 716, state variables 718, and primary outputs 720. Furthermore, dead-end detector 706 can generate a dead-end variable 724, which propagates to optimized assumptions 704 and optimized assertions 708, and identifies whether optimized CUV 702 is operating within a dead-end state. In some variations on these embodiments, dead-end detector 706 is generated from the same set of N-tight assumptions used to create stimulus generator 604 of FIG. 6.

In some embodiments, optimized assumptions 704 can take as input primary inputs 712, random inputs 716, state variables 718, and primary outputs 720. Furthermore, optimized assumptions 706 can generate a validity variable 722, which propagates to optimized assertions 708, and identifies whether the constraints in optimized assumptions 704 are satisfied by the operating environment of optimized CUV 702 (i.e., the constraints have not failed due to an illegal combination of primary inputs 712, random inputs 716, state variables 718, and/or primary outputs 720). In some variations on these embodiments, optimized assumptions 704 are M-tight, such that M>N; therefore, optimized assumptions 704 are capable of representing a larger legal environment for optimized CUV 702 than dead-end detector 706.

In some embodiments, optimized assertions 708 can take as input primary inputs 712, random inputs 716, state variables 718, primary outputs 720, validity variable 722, and dead-end variable 724. Furthermore, optimized assertions 708 do not fail when validity variable 722 specifies that CUV 702 is not operating in a legal state with legal primary input values (i.e., at least one assumption in optimized assumptions 704 has failed) or dead-end variable 724 specifies that optimized CUV 702 is operating in a dead-end state. This configuration for optimized assertions 708 enables a formal verification system to use optimized assertions 708 to determine whether a number of constraints for optimized CUV 702 do not fail when optimized CUV 702 is operating within a legal operating environment.

Figure 8:
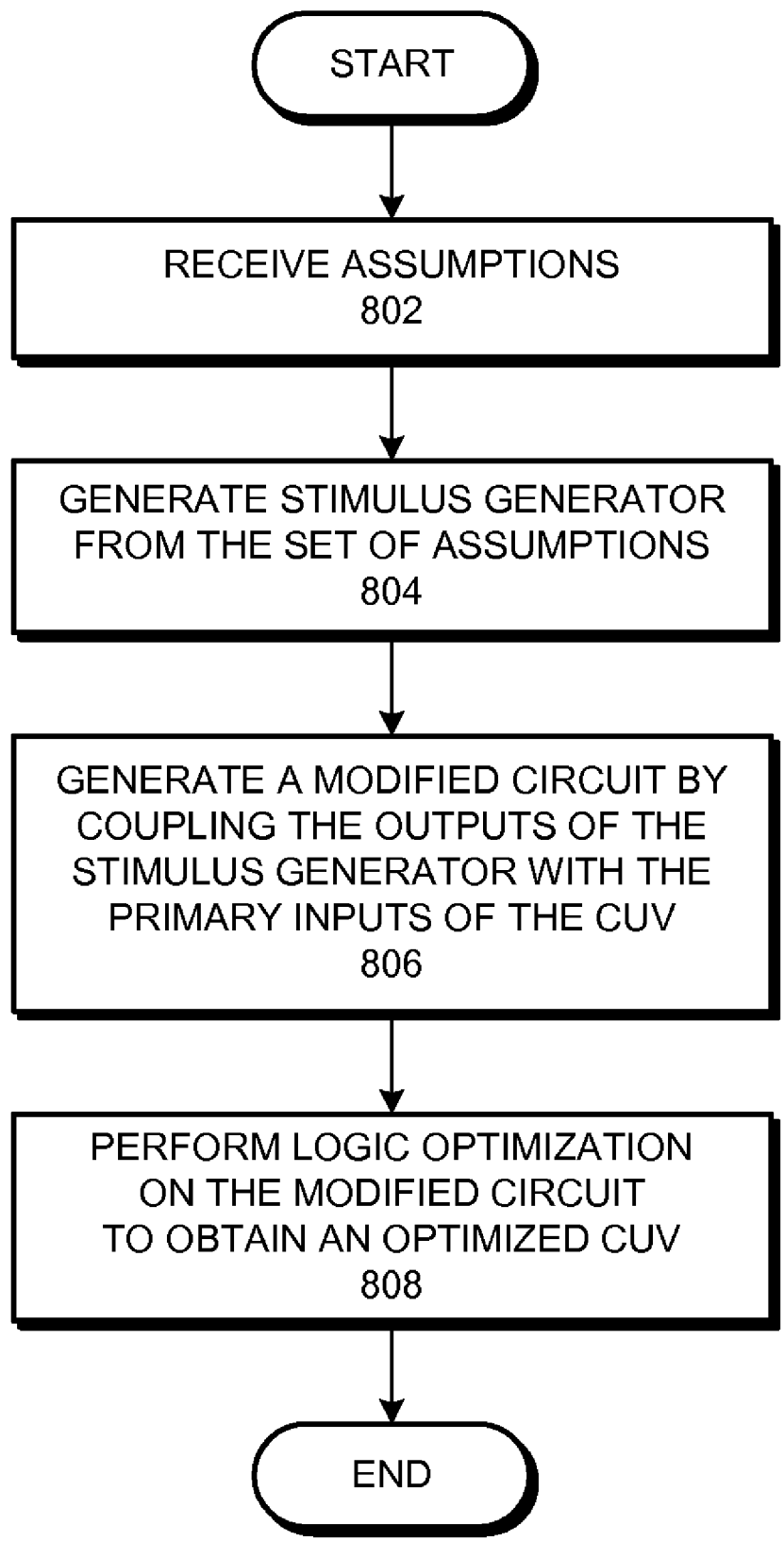
FIG. 8 presents a flow chart illustrating a process for optimizing a circuit for formal verification in accordance with an embodiment of the present invention.

FIG. 8 presents a flow chart illustrating a process for optimizing a circuit for formal verification in accordance with an embodiment of the present invention. A logic optimization system can perform the process by first receiving a set of assumptions for a CUV (operation 802). Then, the system can generate a stimulus generator based on the set of assumptions (operation 804), and generate a modified circuit by coupling the outputs of the stimulus generator with the primary inputs of the CUV (operation 806). The system can then perform logic optimization on the modified circuit to obtain an optimized CUV (operation 808). Note that the system performs optimization on the modified circuit which includes both the stimulus generator and the CUV. Optimizing the modified circuit can result in a circuit that is more optimized than the circuit that would have resulted if only the CUV had been optimized. This is because the stimulus generator restricts the values that the CUV's primary inputs can take on, and hence, the optimization process can find more opportunities for optimization than it would have found if it was only optimizing the CUV.

Figure 9:
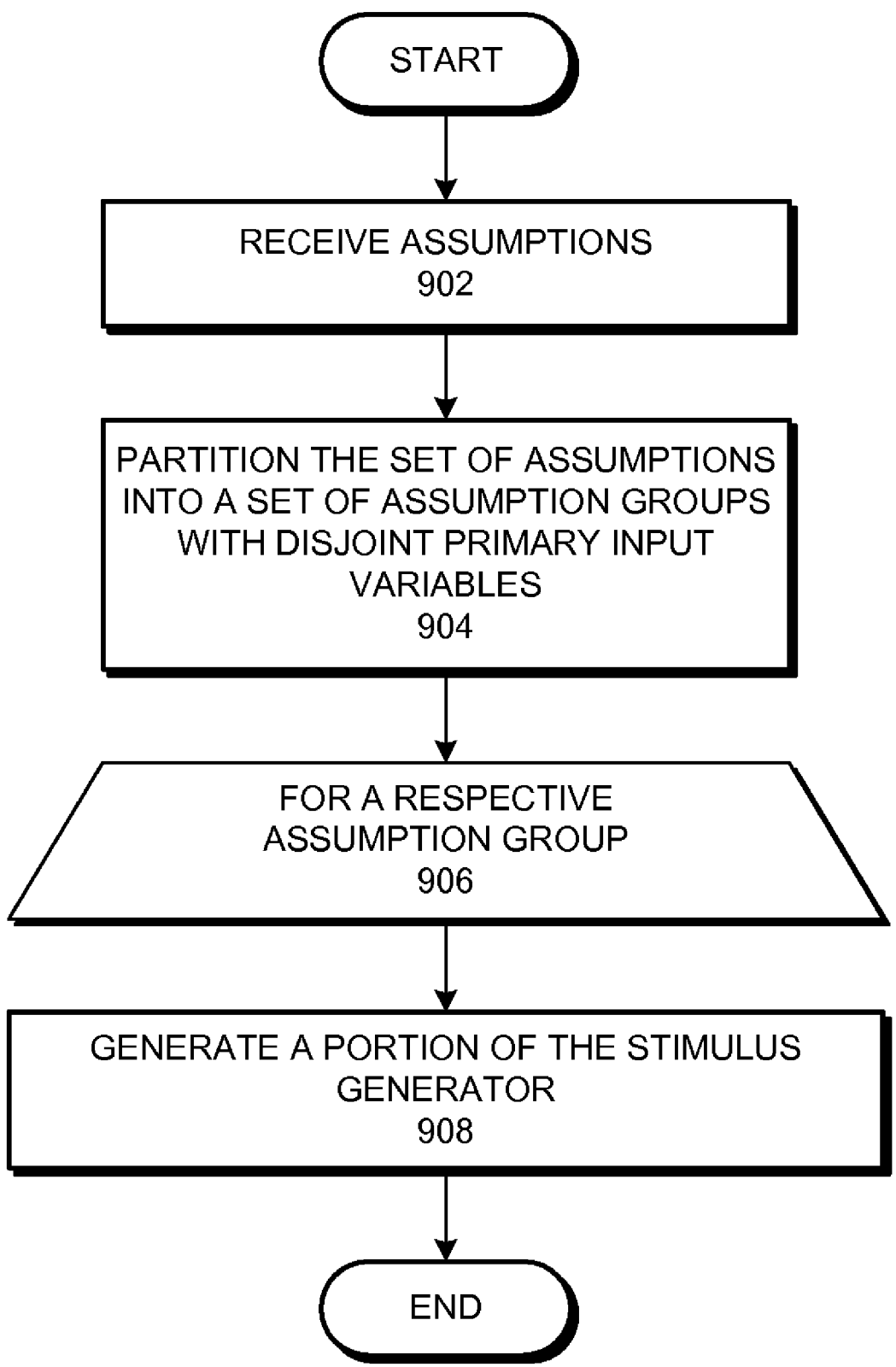
FIG. 9 presents a flow chart illustrating a process for generating a set of disjoint stimulus generator portions for a set of assumptions in accordance with an embodiment of the present invention.

FIG. 9 presents a flow chart illustrating a process for generating a set of disjoint stimulus generator portions based on a set of assumptions in accordance with an embodiment of the present invention. The process for generating a stimulus generator can correspond to operation 804 in FIG. 8. A computer system can perform the process by first receiving a set of assumptions (operation 902), and partitioning the set of assumptions into a set of assumption groups with disjoint primary input variables (operation 904). Then, for a respective assumption group (operation 906), the system generates a portion of the stimulus generator (operation 908).

Figure 10:
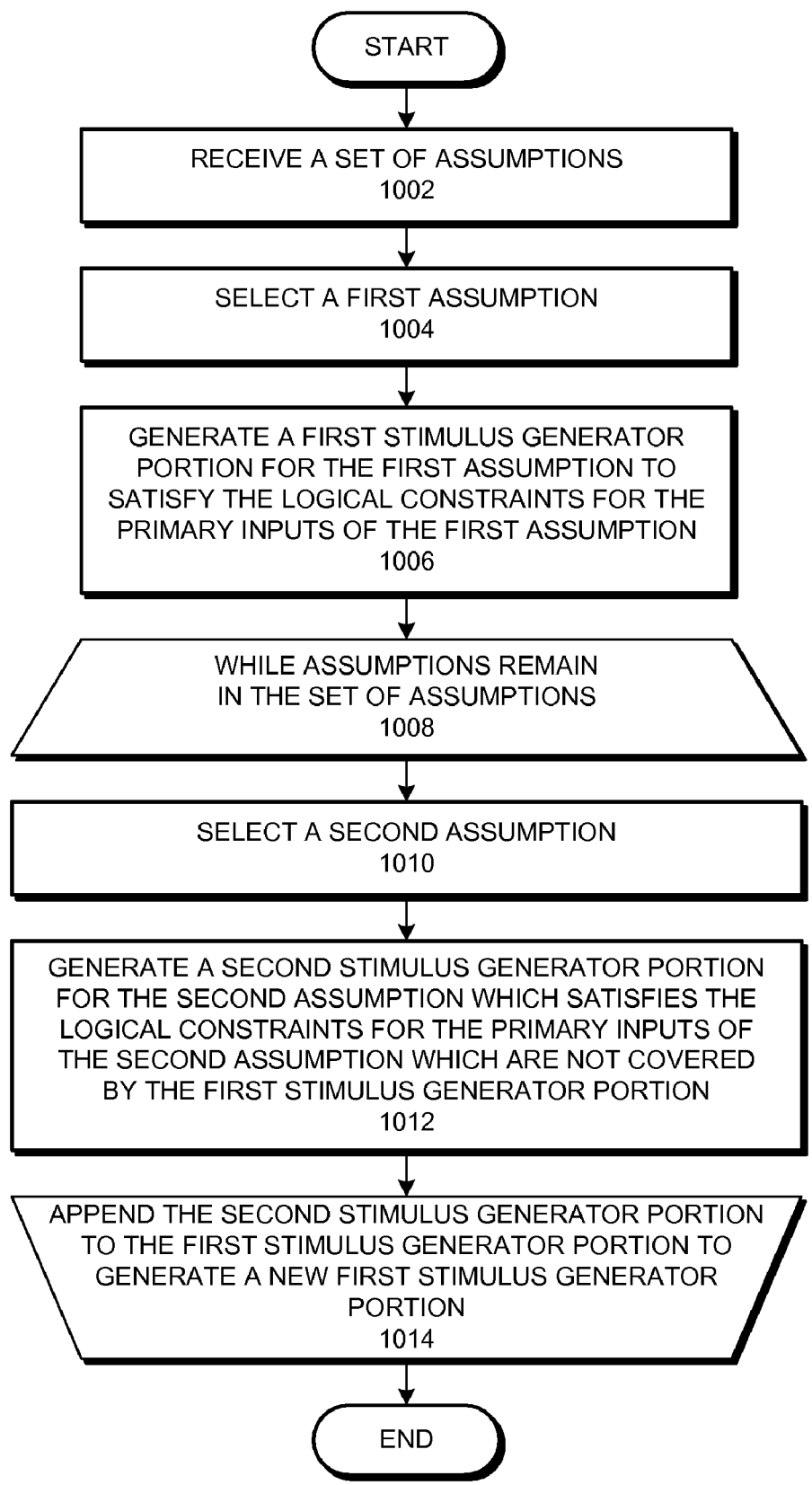
FIG. 10 presents a flow chart illustrating a process for generating a stimulus generator for a set of assumptions in accordance with an embodiment of the present invention.

FIG. 10 presents a flow chart illustrating a process for generating a stimulus generator for a set of assumptions in accordance with an embodiment of the present invention. A computer system can perform the process by first receiving a set of assumptions (operation 1002), and selecting a first assumption from the set of assumptions (operation 1004). In some variations on this embodiment, the system selects the first assumption from the set of assumptions which has the lowest N-tight complexity. Next, the system generates a first stimulus generator portion, for the first assumption, which satisfies the logical constraints for the primary inputs of the first assumption (operation 1006).

Then, while assumptions remain in the set of assumptions (operation 1008), the system performs the following operations. The system selects a second assumption from the set of assumptions (operation 1010), and generates a second stimulus generator portion, for the second assumption, which satisfies the logical constraints for the primary inputs of the second assumption which are not satisfied by the stimulus generator portion (operation 1012). In some variations on this embodiment, the system selects the second assumption from the set of assumptions which has the lowest N-tight complexity. The system then appends the second stimulus generator portion to the first stimulus generator portion to generate a new first stimulus generator portion (operation 1014).

Figure 11:
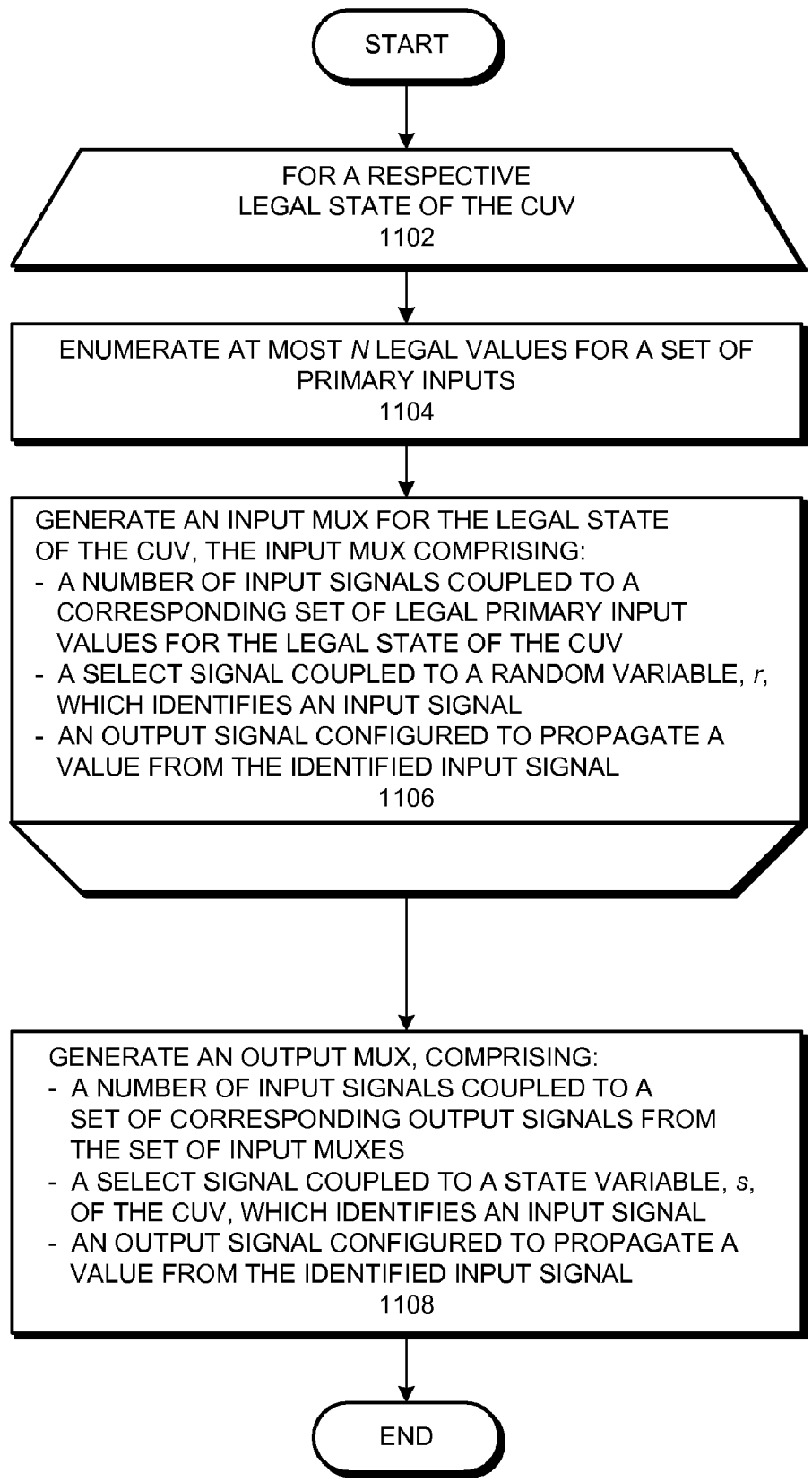
FIG. 11 presents a flow chart illustrating a process for implementing a portion of a stimulus generator in accordance with an embodiment of the present invention.

FIG. 11 presents a flow chart illustrating a process for implementing a portion of a stimulus generator, which corresponds to step 1006 in FIG. 10, in accordance with an embodiment of the present invention. A computer system can perform the process as follows. For a respective legal state of the CUV (operation 1102), the system enumerates at most N legal values for a set of primary inputs (operation 1104), and generates an input multiplexer for the legal state of the CUV (operation 1106). The input multiplexer comprises a number of input signals coupled to a corresponding set of legal primary input values for the respective legal state of the CUV, and comprises a select signal coupled to a random variable, r, which identifies an input signal of the input multiplexer. Furthermore, the input multiplexer also comprises an output signal configured to propagate a value from the identified input signal. In some variations, the random variable r satisfies the expression $0 \leq r < N$.

Then, the system generates an output multiplexer which is configured to propagate an output signal from a respective input multiplexer (operation 1108). The output multiplexer comprises a number of input signals coupled to a set of corresponding output signals from the set of input multiplexers, and comprises a select signal coupled to a state variable, s, of the CUV which identifies an input signal of the output multiplexer. The output multiplexer also comprises an output signal configured to propagate a value from the identified input signal.

Computer System

Figure 12:
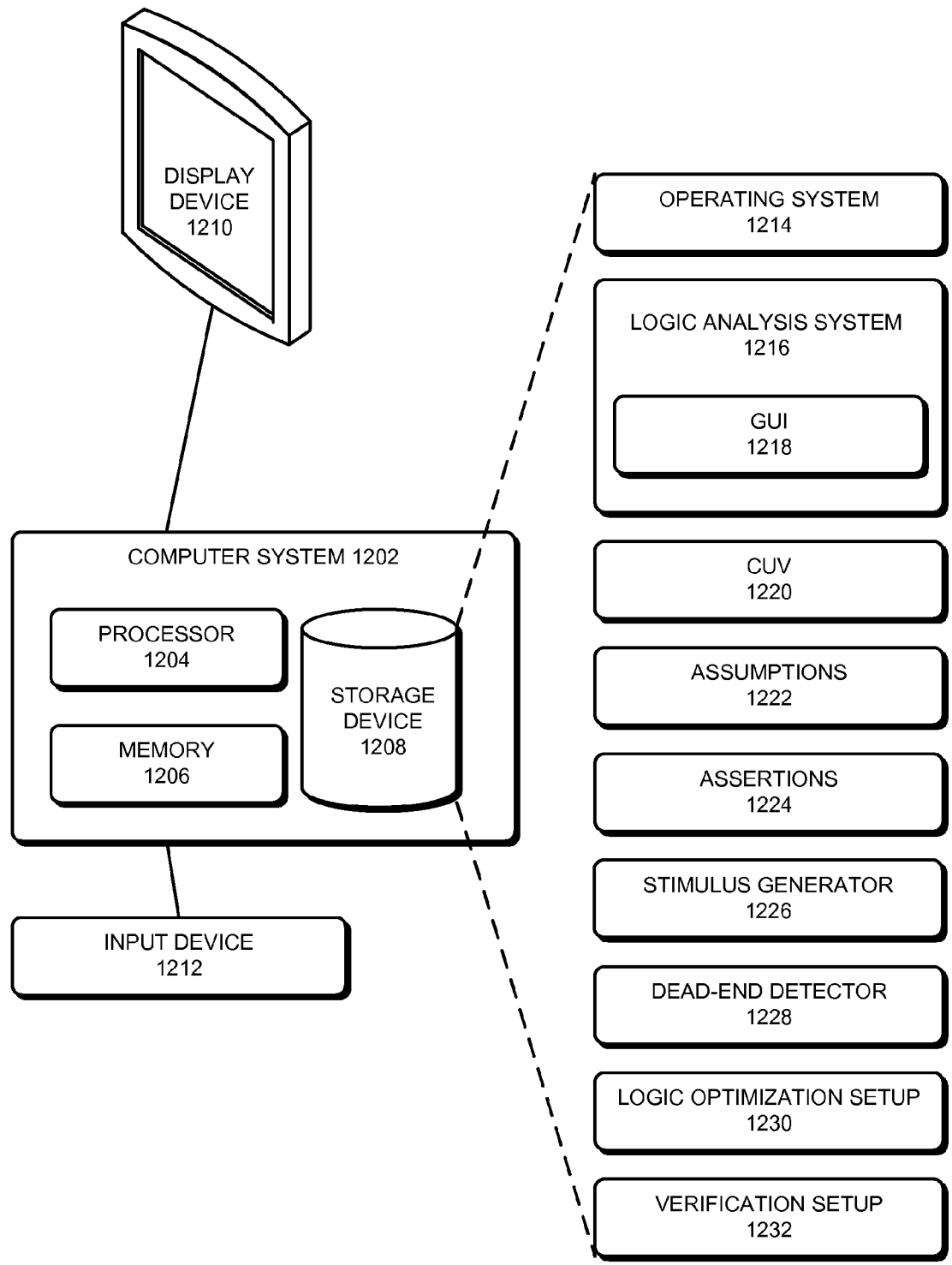
FIG. 12 illustrates an exemplary computer system that facilitates optimizing a circuit design during a logic design stage to reduce routing congestion during a placement and routing stage in accordance with an embodiment of the present invention.

FIG. 12 illustrates an exemplary computer system that facilitates optimizing a circuit design during a logic design stage to reduce routing congestion during a placement and routing stage in accordance with an embodiment of the present invention. Computer system 1202 includes a processor 1204, a memory 1206, and a storage device 1208. Furthermore, computer system 1202 can be coupled to a display device 1210 and an input device 1212.

Storage device 1208 stores an operating system 1214, a logic analysis system 1216, a CUV 1220, assumptions 1222, assertions 1224, stimulus generator 1226, and a dead-end detector 1228. Logic analysis system 1216 can include a graphical user interface (GUI) 1218. During operation, logic analysis system 1216 is loaded from storage device 1208 into memory 1206 and is executed by processor 1204. In some variations, logic analysis system 1216 can be implemented in a hardware module, such as an ASIC.

Logic analysis system 1216 takes assumptions 1222 as input to generate stimulus generator 1226 and dead-end detector 1228 for CUV 1220. Logic analysis system 1216 can then generate logic optimization setup 1230, which includes CUV 1220, assumptions 1222, assertions 1224, and stimulus generator 1226. Logic optimization setup 1230 can be processed by a logic optimization system to generate an optimized CUV for CUV 1220. Logic analysis system 1216 can also generate verification setup 1232, which includes the optimized CUV, assumptions 1222, assertions 1224, and dead-end detector 1228. Verification setup 1232 can be used by a circuit verification system to perform hybrid or formal verification on the optimized CUV.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method to optimize and verify a first circuit, the method comprising:
   receiving the first circuit and a set of assumptions associated with the first circuit, wherein the set of assumptions specify a first set of logical constraints on at least a set of primary inputs of the first circuit, and wherein the set of assumptions are expected to be satisfied during normal circuit operation;
   generating a stimulus generator circuit based in part on an assumption in the set of assumptions, wherein output values from the stimulus generator circuit, which when assigned to the set of primary inputs of the first circuit, cause the set of primary inputs to satisfy the assumption;
   generating a modified circuit by coupling the outputs of the stimulus generator circuit with a set of primary inputs of the first circuit; and
   performing, by computer, logic optimization on the modified circuit to obtain an optimized circuit.

2. The method of claim 1, wherein the method further comprises:
   receiving a set of assertions associated with the first circuit, wherein the set of assertions specify logical constraints on at least a set of outputs of the first circuit, wherein the set of assertions model a desired behavior of the first circuit; and
   performing functional verification on the optimized circuit to verify that the set of assertions are satisfied whenever the set of assumptions are satisfied.

3. The method of claim 2, wherein the set of assertions specify logical constraints on the set of primary inputs of the first circuit, a set of state variables of the first circuit, and a set of outputs of the first circuit.

4. The method of claim 1, wherein the set of assumptions specify logical constraints on the set of primary inputs of the first circuit, a set of state variables of the first circuit, and a set of outputs of the first circuit.

5. The method of claim 1, wherein generating the stimulus generator comprises:
   partitioning the set of assumptions into a set of assumption groups, wherein any two assumptions in an assumption group share at least one common primary input, wherein the set of assumption groups includes a first assumption group and a second assumption group, and wherein the first assumption group's primary inputs are disjoint from the second assumption group's primary inputs;
   generating a first portion of the stimulus generator based in part on the first assumption group; and
   generating a second portion of the stimulus generator based in part on the second assumption group.

6. The method of claim 5, wherein prior to partitioning the set of assumptions into a set of assumption groups, generating the stimulus generator further comprises reclassifying a number of primary inputs of an assumption as state variables for at least the duration of the partitioning operation.

7. The method of claim 1, wherein generating the stimulus generator comprises generating a second circuit by:
   selecting a first assumption from the set of assumptions, and generating a first portion of the stimulus generator to satisfy the logical constraints for the primary inputs of the first assumption; and
   while assumptions remain in the set of assumptions:
   selecting a second assumption from the set of assumptions;
   generating a second portion of the stimulus generator which satisfies the logical constraints for the primary inputs of the second assumption which are not covered by the first portion of the stimulus generator; and
   appending the second portion of the stimulus generator to the first portion of the stimulus generator, thereby generating a new first portion of the stimulus generator which satisfies the logical constraints for the primary inputs of the second assumption.

8. The method of claim 7, wherein generating the first portion of the stimulus generator to satisfy the logical constraints for the primary inputs of the first assumption comprises:
   processing the first assumption to enumerate, for a respective legal state of the circuit, a number of legal values for a set of primary inputs;
   generating an input multiplexer associated with a respective legal state of the circuit, which comprises a first set of input signals, a first select signal, and a first output signal, by:
   coupling an input signal of the first set of input signals to a corresponding legal primary input value for the legal state of the circuit;
   coupling the first select signal to a random variable which identifies an input signal of the first set of input signals; and
   configuring the first output signal to propagate a value from the identified input signal of the first set of input signals; and
   generating an output multiplexer comprising a second set of input signals, a second select signal, and a second output signal, by:
   coupling an input signal of the second set of input signals to the first output signal of a corresponding input multiplexer;
   coupling the second select signal to a state variable of the circuit to identify an input signal of the second set of signals; and
   configuring the second output signal to propagate a value from the identified input signal of the second set of input signals.

9. A non-transitory computer-readable storage medium storing instructions that when executed by a computer cause the computer to perform a method to optimize and verify a first circuit, the method comprising:

receiving the first circuit and a set of assumptions associated with the first circuit, wherein the set of assumptions specify a first set of logical constraints on at least a set of primary inputs of the first circuit, and wherein the set of assumptions are expected to be satisfied during normal circuit operation;

generating a stimulus generator circuit based in part on an assumption in the set of assumptions, wherein output values from the stimulus generator circuit, which when assigned to the set of primary inputs of the first circuit, cause the set of primary inputs to satisfy the assumption;

generating a modified circuit by coupling the outputs of the stimulus generator circuit with a set of primary inputs of the first circuit; and performing logic optimization on the modified circuit to obtain an optimized circuit.

10. The computer-readable storage medium of claim 9, wherein the method further comprises:

receiving a set of assertions associated with the first circuit, wherein the set of assertions specify logical constraints on at least a set of outputs of the first circuit, wherein the set of assertions model a desired behavior of the first circuit; and performing functional verification on the optimized circuit to verify that the set of assertions are satisfied whenever the set of assumptions are satisfied.

11. The computer-readable storage medium of claim 10, wherein the set of assertions specify logical constraints on the set of primary inputs of the first circuit, a set of state variables of the first circuit, and a set of outputs of the first circuit.

12. The computer-readable storage medium of claim 9, wherein the set of assumptions specify logical constraints on the set of primary inputs of the first circuit, a set of state variables of the first circuit, and a set of outputs of the first circuit.

13. The computer-readable storage medium of claim 9, wherein generating the stimulus generator comprises:

partitioning the set of assumptions into a set of assumption groups, wherein any two assumptions in an assumption group share at least one common primary input, wherein the set of assumption groups includes a first assumption group and a second assumption group, and wherein the first assumption group's primary inputs are disjoint from the second assumption group's primary inputs;

generating a first portion of the stimulus generator based in part on the first assumption group; and generating a second portion of the stimulus generator based in part on the second assumption group.

14. The computer-readable storage medium of claim 13, wherein prior to partitioning the set of assumptions into a set of assumption groups, generating the stimulus generator further comprises reclassifying a number of primary inputs of an assumption as state variables for at least the duration of the partitioning operation.

15. The computer-readable storage medium of claim 9, wherein generating the stimulus generator comprises generating a second circuit by:

selecting a first assumption from the set of assumptions, and generating a first portion of the stimulus generator to satisfy the logical constraints for the primary inputs of the first assumption; and while assumptions remain in the set of assumptions:

selecting a second assumption from the set of assumptions;

generating a second portion of the stimulus generator which satisfies the logical constraints for the primary inputs of the second assumption which are not covered by the first portion of the stimulus generator; and appending the second portion of the stimulus generator to the first portion of the stimulus generator, thereby generating a new first portion of the stimulus generator which satisfies the logical constraints for the primary inputs of the second assumption.

16. The computer-readable storage medium of claim 15, wherein generating the first portion of the stimulus generator to satisfy the logical constraints for the primary inputs of the first assumption comprises:

processing the first assumption to enumerate, for a respective legal state of the circuit, a number of legal values for a set of primary inputs;

generating an input multiplexer associated with a respective legal state of the circuit, which comprises a first set of input signals, a first select signal, and a first output signal, by:

coupling an input signal of the first set of input signals to a corresponding legal primary input value for the legal state of the circuit;

coupling the first select signal to a random variable which identifies an input signal of the first set of input signals; and configuring the first output signal to propagate a value from the identified input signal of the first set of input signals; and generating an output multiplexer comprising a second set of input signals, a second select signal, and a second output signal, by:

coupling an input signal of the second set of input signals to the first output signal of a corresponding input multiplexer;

coupling the second select signal to a state variable of the circuit to identify an input signal of the second set of signals; and configuring the second output signal to propagate a value from the identified input signal of the second set of input signals.

17. An apparatus that optimizes and verifies a first circuit, comprising:

a receiving mechanism configured to receive the first circuit and a set of assumptions associated with the first circuit, wherein the set of assumptions specify a first set of logical constraints on at least a set of primary inputs of the first circuit, and wherein the set of assumptions are expected to be satisfied during normal circuit operation;

a computation mechanism configured to:

generate a stimulus generator circuit based in part on an assumption in the set of assumptions, wherein output values from the stimulus generator circuit, which when assigned to the set of primary inputs of the first circuit, cause the set of primary inputs to satisfy the assumption; and generate a modified circuit by coupling the outputs of the stimulus generator circuit with a set of primary inputs of the first circuit; and a logic-optimization mechanism configured to perform logic optimization on the modified circuit to generate an optimized circuit.

18. The apparatus of claim 17, wherein the receiving mechanism is further configured to receive a set of assertions associated with the first circuit, wherein the set of assertions specify logical constraints on at least a set of outputs of the first circuit, and wherein the set of assertions model a desired behavior of the first circuit; and wherein the apparatus further comprises a functional verification mechanism configured to perform functional verification on the optimized circuit to verify that the set of assertions are satisfied whenever the set of assumptions are satisfied.

19. The apparatus of claim 18, wherein the set of assertions specify logical constraints on the set of primary inputs of the first circuit, a set of state variables of the first circuit, and a set of outputs of the first circuit.

20. The apparatus of claim 17, wherein the set of assumptions specify logical constraints on the set of primary inputs of the first circuit, a set of state variables of the first circuit, and a set of outputs of the first circuit.

21. The apparatus of claim 17, wherein generating the stimulus generator comprises:
   partitioning the set of assumptions into a set of assumption groups, wherein any two assumptions in an assumption group share at least one common primary input, wherein the set of assumption groups includes a first assumption group and a second assumption group, and wherein the first assumption group's primary inputs are disjoint from the second assumption group's primary inputs;
   generating a first portion of the stimulus generator based in part on the first assumption group; and
   generating a second portion of the stimulus generator based in part on the second assumption group.

22. The apparatus of claim 21, wherein prior to partitioning the set of assumptions into a set of assumption groups, generating the stimulus generator further comprises reclassifying a number of primary inputs of an assumption as state variables for at least the duration of the partitioning operation.

23. The apparatus of claim 17, wherein generating the stimulus generator comprises generating a second circuit by:
   selecting a first assumption from the set of assumptions, and generating a first portion of the stimulus generator to satisfy the logical constraints for the primary inputs of the first assumption; and
   while assumptions remain in the set of assumptions:
   selecting a second assumption from the set of assumptions;
   generating a second portion of the stimulus generator which satisfies the logical constraints for the primary inputs of the second assumption which are not covered by the first portion of the stimulus generator; and
   appending the second portion of the stimulus generator to the first portion of the stimulus generator, thereby generating a new first portion of the stimulus generator which satisfies the logical constraints for the primary inputs of the second assumption.

24. The apparatus of claim 23, wherein generating the first portion of the stimulus generator to satisfy the logical constraints for the primary inputs of the first assumption comprises:
   processing the first assumption to enumerate, for a respective legal state of the circuit, a number of legal values for a set of primary inputs;
   generating an input multiplexer associated with a respective legal state of the circuit, which comprises a first set of input signals, a first select signal, and a first output signal, by:
   coupling an input signal of the first set of input signals to a corresponding legal primary input value for the legal state of the circuit;
   coupling the first select signal to a random variable which identifies an input signal of the first set of input signals; and
   configuring the first output signal to propagate a value from the identified input signal of the first set of input signals; and
   generating an output multiplexer comprising a second set of input signals, a second select signal, and a second output signal, by:
   coupling an input signal of the second set of input signals to the first output signal of a corresponding input multiplexer;
   coupling the second select signal to a state variable of the circuit to identify an input signal of the second set of signals; and
   configuring the second output signal to propagate a value from the identified input signal of the second set of input signals.

* * * * *